United States Patent
Natsumeda

(10) Patent No.: US 9,547,051 B2
(45) Date of Patent: **\*Jan. 17, 2017**

(54) CALCULATING METHOD OF MAGNETIC FORCE CHARACTERISTIC, AND MAGNETIC FORCE CHARACTERISTIC COMPUTING DEVICE

(75) Inventor: Mitsutoshi Natsumeda, Osaka (JP)

(73) Assignee: Hitachi Metals, Ltd., Tokyo (JP)

( * ) Notice: Subject to any disclaimer, the term of this patent is extended or adjusted under 35 U.S.C. 154(b) by 672 days.

This patent is subject to a terminal disclaimer.

(21) Appl. No.: 14/112,911

(22) PCT Filed: May 15, 2012

(86) PCT No.: PCT/JP2012/062396
§ 371 (c)(1),
(2), (4) Date: Oct. 18, 2013

(87) PCT Pub. No.: WO2012/157637
PCT Pub. Date: Nov. 22, 2012

(65) Prior Publication Data
US 2014/0046608 A1    Feb. 13, 2014

(30) Foreign Application Priority Data
May 17, 2011    (JP) .................................. 2011-110533

(51) Int. Cl.
*G01R 33/16*    (2006.01)
*G01R 33/00*    (2006.01)
(Continued)

(52) U.S. Cl.
CPC ........... *G01R 33/16* (2013.01); *G01R 33/0064* (2013.01); *G01R 33/0385* (2013.01); *H01F 41/0293* (2013.01)

(58) Field of Classification Search
CPC ...................................................... G01R 33/16
(Continued)

(56) References Cited

U.S. PATENT DOCUMENTS 9,372,244 B2 * 6/2016 Natsumeda ........ G01R 33/0064
2005/0151609 A1    7/2005 Natsumeda et al.
(Continued)

FOREIGN PATENT DOCUMENTS

JP    H11-053422 A    2/1999
JP    2004127056 A    4/2004
(Continued)

OTHER PUBLICATIONS

Natsumeda et al., "Analysis Method for Motor with Dy deposition diffusion processed Nd—Fe—B sintered magnet", The Institute of Electrical Engineers of Japan Kenkyukai Shiryo SA, Seishiki Kenkyukai, vol. 14, pp. 37-42 (2011).
(Continued)

*Primary Examiner* — Bryan Bui
(74) *Attorney, Agent, or Firm* — Bret E. Field; Bozicevic, Field & Fancis LLP

(57) ABSTRACT

A prestored database indicating a correspondence of δ (depth)/ΔHcJ (coercivity increment) and a prestored database indicating information of Dy diffusion condition (diffusion coefficient, diffusion flux and processing time regarding Dy diffusion) are used to compute distribution of Dy introduction amount in a magnet from shape information of the magnet and information of a Dy introduction face and compute distribution of ΔHcJ in the magnet from the distribution of Dy introduction amount. Regarding a magnet having a coercivity that is distributed non-uniformly, a J/H curve is computed using the computed distribution of ΔHcJ, and a demagnetizing factor at a predetermined temperature is computed using a temperature coefficient.

10 Claims, 17 Drawing Sheets

(51) Int. Cl.
 *G01R 33/038* (2006.01)
 *H01F 41/02* (2006.01)
(58) Field of Classification Search
 USPC .......................................................... 702/57
 See application file for complete search history.

(56) References Cited

U.S. PATENT DOCUMENTS

| | | |
|---|---|---|
| 2008/0245442 A1 | 10/2008 | Nakamura et al. |
| 2008/0286595 A1 | 11/2008 | Yoshimura et al. |
| 2010/0109468 A1 | 5/2010 | Natsumeda et al. |
| 2011/0150691 A1 | 6/2011 | Nakamura et al. |
| 2012/0229240 A1 | 9/2012 | Yoshimura et al. |

FOREIGN PATENT DOCUMENTS

| | | | |
|---|---|---|---|
| JP | 2004-183099 A | | 7/2004 |
| JP | 2004257879 A | | 9/2004 |
| JP | 2008-506376 A | | 3/2008 |
| JP | 2010-034365 A | | 2/2010 |
| JP | 2011-078270 A | | 4/2011 |
| JP | 2011-091119 A | | 5/2011 |
| WO | WO 2006043348 A1 | | 4/2006 |
| WO | WO 2007102391 A1 | | 9/2007 |
| WO | WO 2008123251 A1 | | 10/2008 |

OTHER PUBLICATIONS

Office Action issued for Japanese application No. 2013-515162 dated Dec. 1, 2015, and its English translation, 8 pages.

\* cited by examiner

F I G. 8
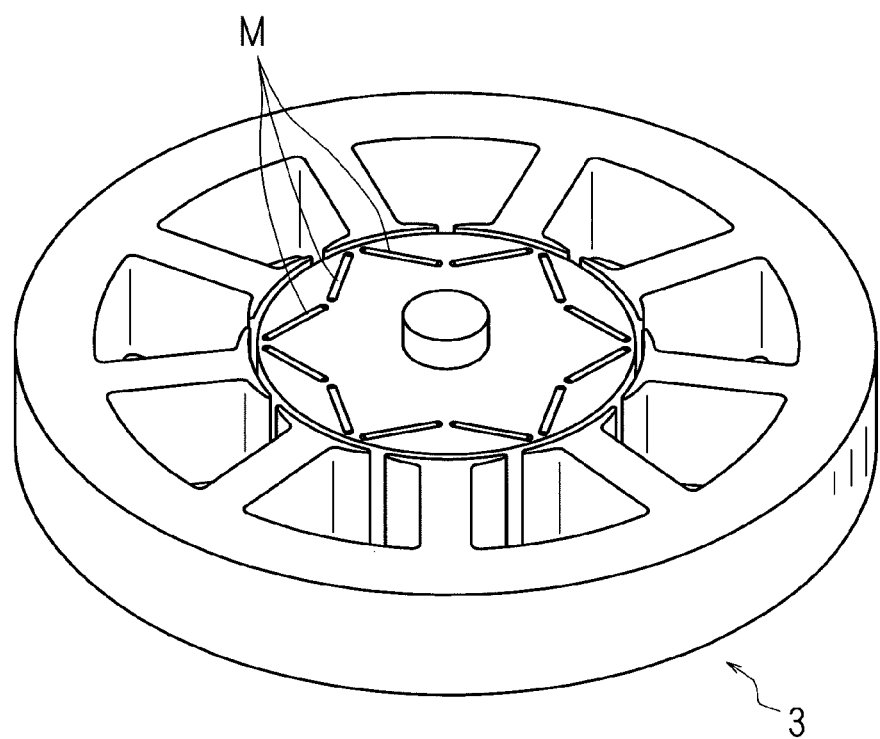

ΔHcJ DISTRIBUTION OF MAGNET WITH THICKNESS OF 9.5mm (a) CENTER PART (b) RIM PART

ΔHcJ DISTRIBUTION OF MAGNET WITH THICKNESS OF 2.5mm (a) CENTER PART (b) RIM PART

Dy DIFFUSED MEMBER (124°C)

CALCULATING METHOD OF MAGNETIC FORCE CHARACTERISTIC, AND MAGNETIC FORCE CHARACTERISTIC COMPUTING DEVICE

This application is the national phase under 35 U.S.C. §371 of PCT International Application No. PCT/JP2012/062396 which has an International filing date of May 15, 2012 and designated the United States of America.

FIELD

The present invention relates to a method for preliminarily storing information of a magnet and computing a magnetic force characteristic of a magnet with operation means, and more particularly to a calculating method of magnetic force characteristic, a magnetic force characteristic computing device and a computer program that can compute a magnetic force characteristic, especially a demagnetization characteristic of the inside of a magnet prepared by introducing and diffusing a heavy rare-earth element such as dysprosium from the surface of the magnet into the inside of the magnet, with a high degree of accuracy.

BACKGROUND

An Nd—Fe—B series sintered magnet is used as a high-performance permanent magnet for various devices, especially hard disk drives or various kinds of motors.

A remanence of an Nd—Fe—B series sintered magnet sometimes decreases (demagnetization) when the magnet is exposed to high temperature or a demagnetizing field is applied. Such demagnetization includes "reversible demagnetization" in which the remanence recovers when the temperature is returned to an ordinary temperature and "irreversible demagnetization" in which the remanence does not recover. Since the various devices mentioned above are used at various temperatures, there is a need that irreversible demagnetization does not occur even when a demagnetizing field is applied at a high temperature. A conventionally utilized technique is to substitute Nd in a main phase of an Nd—Fe—B series sintered magnet with a heavy rare-earth element such as dysprosium (Dy) by adding the heavy rare-earth element to the magnet so as to prepare a magnet having a high coercivity, in which irreversible demagnetization does not occur even when a demagnetizing field is applied at a high temperature. The "irreversible demagnetization" will be hereinafter expressed simply as "demagnetization" in the present specification.

In the method of substituting Nd in an Nd—Fe—B series sintered magnet with a heavy rare-earth element, however, the remanence still lowers when a coercivity increases. Moreover, it is required to reduce the amount of a heavy rare-earth element to be used while maintaining the heat resistance, since a heavy rare-earth element is a scarce resource. Therefore, a technique has been proposed to supply a heavy rare-earth element such as dysprosium from a diffusion source to the surface of a magnet and make a layer having a high density of a heavy rare-earth element at an outer periphery of the main phase of the magnet by thermal diffusion mainly consisting of grain boundary diffusion (WO 2007/102391). Disclosed in WO 2006/43348 is a technique to diffuse a heavy rare-earth element such as dysprosium from the surface of a magnet into the magnet. This enables manufacturing of a high-performance permanent magnet having an enhanced coercivity while inhibiting lowering of the remanence of the entire permanent magnet.

When a magnet is used for a motor or the like, it is important to know the magnetic force characteristic of the magnet, especially a demagnetizing factor due to heat or the like, in order to design a magnet appropriately and to decide specifications such as characteristics of a motor. Disclosed in Japanese Patent Application Laid-Open No. 2004-127056, Japanese Patent Application Laid-Open No. 2004-257879 and WO 2008/123251 are methods for evaluating demagnetization of a permanent magnet.

SUMMARY

In an Nd—Fe—B series sintered magnet prepared by introducing a heavy rare-earth element such as dysprosium from the surface of a magnet and diffusing it into an outer periphery of the main phase or the inside of the magnet, a coercivity is especially high in the vicinity of the surface of the magnet and is not uniform in the depth direction. Moreover, a coercivity changes non-linearly with temperature variation and a demagnetizing field also varies with location, and therefore a demagnetizing factor also varies with location.

Accordingly, there is a need to obtain a demagnetizing factor at each location inside a magnet having a different coercivity, in order to obtain a demagnetizing factor with a high degree of accuracy regarding an Nd—Fe—B series sintered magnet prepared by diffusing a heavy rare-earth element from the surface of a magnet into the outer periphery of the main phase to cause non-uniform distribution thereof.

All of the techniques disclosed in Japanese Patent Application Laid-Open No. 2004-127056, Japanese Patent Application Laid-Open No. 2004-257879 and WO 2008/123251 are methods for obtaining a demagnetizing factor for each location in a magnet, wherein an initial value is computed from a magnetic flux density and a demagnetizing factor of the entire magnet measured in the bulk. In contrast, the present inventor has found that it is possible to reproduce an actually measured value with a high degree of accuracy as a result of estimating distribution of a coercivity in a magnet after diffusion treatment using information of a known coercivity increment of a dysprosium diffused magnet. When coercivity distribution before demagnetization in an Nd—Fe—B series sintered magnet prepared by diffusing a heavy rare-earth element can be estimated, it is then possible to compute a demagnetizing factor at a different part in the magnet with a high degree of accuracy.

The present invention has been made in view of such a finding, and the object thereof is to provide a calculating method of magnetic force characteristic and a magnetic force characteristic computing device that can compute distribution of a coercivity increment of the inside of a magnet prepared by introducing and diffusing a heavy rare-earth element from the surface of the magnet into the inside of the magnet, and a magnetic force characteristic, especially a demagnetization characteristic, with a high degree of accuracy.

A calculating method of magnetic force characteristic according to the present invention is a method for obtaining a magnetic force characteristic in a magnet prepared by introducing a heavy rare-earth element from a surface of the magnet and diffusing the heavy rare-earth element into the inside of the magnet, characterized by comprising: preliminarily storing introduction amount/coercivity increment characteristic information indicating a characteristic of an increment of a coercivity due to introduction and diffusion against introduction amount of a heavy rare-earth element and information of diffusion condition containing a diffusion coefficient, a diffusion flux and a processing time regarding diffusion of a heavy rare-earth element; a first step of accepting shape information indicating a dimension and a shape of the magnet; a second step of accepting introduction face information in accordance with the accepted shape information; a third step of computing introduction amount distribution of the introduced heavy rare-earth element in the magnet by using a diffusion equation based on the stored information of diffusion condition; and a fourth step of computing distribution of a coercivity increment due to introduction and diffusion of a heavy rare-earth element in the magnet, based on the computed introduction amount distribution and the stored introduction amount/coercivity increment characteristic information.

A calculating method of magnetic force characteristic according to the present invention is characterized in that the diffusion coefficient is expressed by a function of concentration dependency of an introduced heavy rare-earth element.

A calculating method of magnetic force characteristic according to the present invention is characterized by further comprising: preliminarily storing a magnetization curve before diffusion of a heavy rare-earth element and information of a temperature coefficient indicating a coercivity variation due to temperature variation of a magnet against different coercivities; a fifth step of computing a magnetization curve at a first predetermined temperature at each location of the magnet, based on the stored magnetization curve and the distribution of a coercivity increment computed in the fourth step; a sixth step of computing a magnetization curve at a second predetermined temperature, based on the computed magnetization curve and the stored information of a temperature coefficient; and a seventh step of computing a demagnetizing factor at the first predetermined temperature after different demagnetizing fields are applied to respective locations at the second predetermined temperature causing demagnetization, based on the magnetization curve computed in the sixth step.

A calculating method of magnetic force characteristic according to the present invention is characterized by further comprising: an eighth step of computing a demagnetization characteristic of the magnet at different temperatures, based on the distribution of a coercivity increment computed in the fourth step; and a ninth step of specifying a demagnetization temperature at which a demagnetizing factor of the magnet becomes equal to or lower than a predetermined factor.

A magnetic force characteristic computing device according to the present invention is a magnetic force characteristic computing device for obtaining a magnetic force characteristic in a magnet prepared by introducing a heavy rare-earth element from a surface of the magnet and diffusing the heavy rare-earth element into inside of the magnet, characterized by comprising: storage means for preliminarily storing introduction amount/coercivity increment characteristic information indicating a characteristic of an increment of a coercivity due to introduction and diffusion against introduction amount of a heavy rare-earth element and information of diffusion condition containing a diffusion coefficient, a diffusion flux and a processing time regarding diffusion of a heavy rare-earth element; means for accepting shape information indicating a dimension and a shape of the magnet; means for accepting introduction face information in accordance with the accepted shape information; means for computing introduction amount distribution of the introduced heavy rare-earth element in the magnet by using a diffusion equation based on the information of diffusion condition stored in the storage means; and coercivity increment distribution computing means for computing distribution of a coercivity increment due to introduction and diffusion of a heavy rare-earth element in the magnet, based on the computed introduction amount distribution and the introduction amount/coercivity increment characteristic information stored in the storage means.

A magnetic force characteristic computing device according to the present invention is characterized by further comprising: means for preliminarily storing a magnetization curve before diffusion of a heavy rare-earth element and information of a temperature coefficient indicating a coercivity variation due to temperature variation of a magnet against different coercivities; means for computing a magnetization curve at a first predetermined temperature at each location of the magnet, based on the stored magnetization curve and the distribution of a coercivity increment computed in the coercivity increment distribution computing means; means for computing a magnetization curve at a second predetermined temperature, based on the computed magnetization curve and the stored information of a temperature coefficient; and means for computing a demagnetizing factor at the first predetermined temperature after different demagnetizing fields are applied to respective locations at the second predetermined temperature causing demagnetization, based on the computed magnetization curve.

A magnetic force characteristic computing device according to the present invention is characterized by further comprising: means for computing a demagnetization characteristic of the magnet at different temperatures, based on the distribution of a coercivity increment computed by the coercivity increment distribution computing means; and means for specifying a demagnetization temperature at which a demagnetizing factor of the magnet becomes equal to or lower than a predetermined factor.

A computer program according to the present invention is a computer program for causing a computer provided with storage means to compute a magnetic force characteristic in a magnet prepared by introducing a heavy rare-earth element from a surface of the magnet and diffusing the heavy rare-earth element into inside of the magnet, using introduction amount/coercivity increment characteristic information indicating a characteristic of an increment of a coercivity due to introduction and diffusion against introduction amount of a heavy rare-earth element and information of diffusion condition containing a diffusion coefficient, a diffusion flux and a processing time regarding diffusion of a heavy rare-earth element stored in the storage means, characterized by causing a computer to execute: a first step of obtaining shape information indicating a dimension and a shape of the magnet; a second step of obtaining introduction face information in accordance with the shape information; a third step of computing introduction amount distribution of the introduced heavy rare-earth element in the magnet by using a diffusion equation based on the stored information of diffusion condition; and a fourth step of computing distribution of a coercivity increment due to introduction and diffusion of a heavy rare-earth element in the magnet, based on the computed introduction amount distribution and the stored introduction amount/coercivity increment characteristic information.

A computer program according to the present invention is characterized by further using storage means storing a magnetization curve before diffusion of a heavy rare-earth element and information of a temperature coefficient indicating a coercivity variation due to temperature variation of a magnet against different coercivities and further causing the computer to execute: a fifth step of computing a magnetization curve at a first predetermined temperature at each location of the magnet, based on the stored magnetization curve and the distribution of a coercivity increment computed in the fourth step; a sixth step of computing a magnetization curve at a second predetermined temperature, based on the computed magnetization curve and the stored information of a temperature coefficient; and a seventh step of computing a demagnetizing factor at the first predetermined temperature after different demagnetizing fields are applied to respective locations at the second predetermined temperature causing demagnetization, based on the magnetization curve computed in the sixth step.

A computer program according to the present invention is characterized by further causing the computer to execute: an eighth step of computing a demagnetization characteristic of the magnet at different temperatures, based on the distribution of a coercivity increment computed in the fourth step; and a ninth step of specifying a demagnetization temperature at which a demagnetizing factor of the magnet becomes equal to or lower than a predetermined factor.

In the present invention, distribution of an introduction amount of a heavy rare-earth element in a magnet is computed by using a diffusion equation based on information of diffusion condition (diffusion coefficient, diffusion flux and processing time) in accordance with information on the shape of a magnet having a magnetic force characteristic to be computed and on an introduction face of the heavy rare-earth element. Distribution of a coercivity increment due to diffusion of a heavy rare-earth element in a magnet is obtained from the computed distribution of an introduction amount. Use of the obtained distribution of a coercivity increment makes it possible to estimate a coercivity varying with location after diffusion with a high degree of accuracy from a uniform coercivity before diffusion.

In the present invention, diffusion coefficient as one of the diffusion condition is prepared by a function of concentration of introduced heavy rare-earth element as a parameter and used in the diffusion equation at the time of computing distribution of introduction amount. This makes it possible to reduce the amount of information to be stored and eliminate the need for interpolation processing, while maintaining the computation accuracy.

In the present invention, a magnetization curve at a first predetermined temperature (e.g., ordinary temperature) at each location of the magnet after diffusion is obtained based on a magnetization curve of a homogeneous magnet (base material) before diffusion and the distribution of a coercivity increment obtained in the invention described above. Moreover, a magnetization curve at a second predetermined temperature (e.g., heating temperature) at each location of the magnet after diffusion is obtained based on the obtained magnetization curve and information of a temperature coefficient indicating variation ratio of coercivity against temperature variation stored for each different coercivity. Furthermore, a magnetization curve (magnetic force characteristic) at each location in the magnet is obtained after a different demagnetizing field is first applied at the second predetermined temperature and then the temperature is returned to the first temperature (ordinary temperature). This makes it possible to compute a demagnetizing factor as the entire magnet with a high degree of accuracy.

In the present invention, a magnetization curve at the first predetermined temperature (e.g., ordinary temperature) of a magnet after diffusion is obtained with a high degree of accuracy based on a magnetization curve of a homogeneous magnet (base material) before diffusion and the distribution of a coercivity increment obtained in the invention described above. Furthermore, a demagnetizing factor of the entire magnet at the first temperature is obtained based on information of a temperature coefficient indicating a temperature variation of a coercivity stored for each different coercivity when a different demagnetizing field is applied at a plurality of second temperatures corresponding to different coercivities at each location in the magnet at a plurality of different second temperatures causing demagnetization, and a demagnetization temperature at which a demagnetizing factor becomes equal to or lower than a predetermined value is specified. This makes it possible to compute a demagnetization characteristic at a high temperature with a high degree of accuracy as a magnetic force characteristic of an Nd—Fe—B series sintered magnet prepared by diffusing a heavy rare-earth element.

With the present invention, it becomes possible to estimate distribution of a coercivity varying with location in a magnet prepared by introducing and diffusing a heavy rare-earth element from the surface into the inside with a high degree of accuracy by computation, and therefore it is possible to compute a magnetic force characteristic as the entire magnet with a high degree of accuracy.

In particular, regarding a magnet intended for use at a high temperature in a motor or the like, it is required to compute an irreversible lowering rate of a remanence, or a so-called an irreversible demagnetizing factor, with a high degree of accuracy. It is also possible to compute a demagnetizing factor with a high degree of accuracy even when diffusion and change in a coercivity against temperature are distributed in a magnet prepared by diffusing a heavy rare-earth element.

The above and further objects and features will more fully be apparent from the following detailed description with accompanying drawings.

BRIEF DESCRIPTION OF THE DRAWINGS

FIG. 8 is a schematic top perspective view of an IPM motor in the present embodiment.

DETAILED DESCRIPTION

The following description will explain the present invention in concrete terms with reference to the drawings illustrating the embodiment.

The following embodiment will be explained using an example, which causes a computer to execute a calculating method of magnetic force characteristic based on a computer program according to the present invention and to operate as a magnetic force characteristic computing device, so as to compute a magnetic force characteristic of an Nd—Fe—B series sintered magnet prepared by diffusing dysprosium (which will be hereinafter written as "Dy") as a heavy rare-earth element.

Figure 1:
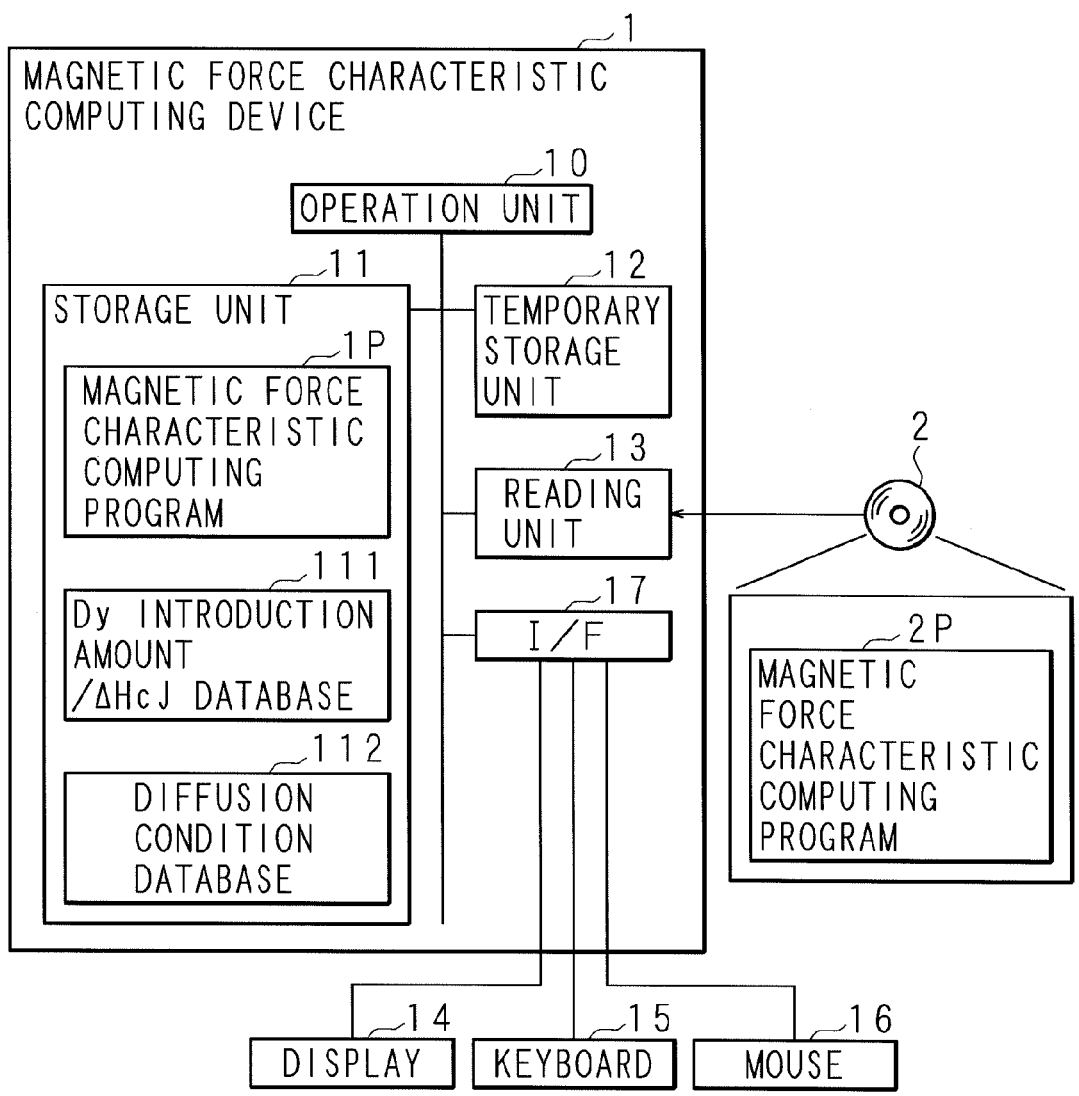
FIG. 1 is a block diagram illustrating the structure of a magnetic force characteristic computing device according to the present embodiment.

FIG. 1 is a block diagram illustrating the structure of a magnetic force characteristic computing device 1 according to the present embodiment. The magnetic force characteristic computing device 1 according to the present embodiment is implemented by a personal computer. The magnetic force characteristic computing device 1 has: an operation unit 10 for controlling operations of the respective components and executing an operation; a storage unit 11 for storing various kinds of information; a temporary storage unit 12 to be utilized for processing of the operation unit 10; a reading unit 13 for reading out information from a portable recording medium 2; and an interface (I/F) 17 for performing relay functions between the operation unit 10 and input-output devices such as a display 14, a keyboard 15 and a mouse 16.

Used as the operation unit 10 is a CPU (Central Processing Unit), an MPU (Micro Processing Unit) or the like. The operation unit 10 reads out a magnetic force characteristic computing program 1P stored in the storage unit 11 and executes the program. This causes the operation unit 10 to execute respective processes for computing a magnetic force characteristic of an Nd—Fe—B series sintered magnet for use in designing.

Used as the storage unit 11 is an external storage device such as a hard disk or an SSD (Solid State Drive). The storage unit 11 stores a Dy introduction amount/ΔHcJ database (introduction amount/coercivity increment characteristic information) 111 and a diffusion condition database (information of diffusion condition including a diffusion coefficient, a diffusion flux and a processing time in the diffusion processing of a rare heavy-earth element such as Dy) 112, which will be described later, in addition to the magnetic force characteristic computing program 1P described above, so that the operation unit 10 can refer in the process of computing a magnetic force characteristic.

Used as the temporary storage unit 12 is a volatile random access memory such as a DRAM (Dynamic Random Access Memory) or an SRAM (Static RAM). The temporary storage unit 12 temporarily stores various kinds of information to be generated by processing of the operation unit 10, such as the magnetic force characteristic computing program 1P to be read out from the storage unit 11.

The reading unit 13 can read out data from the portable recording medium 2 such as a DVD, a CD-ROM or a flexible disk. Recorded in the portable recording medium 2 is a magnetic force characteristic computing program 2P for causing a computer to operate as a magnetic force characteristic computing device 1. The magnetic force characteristic computing program 1P stored in the storage unit 11 may be obtained by copying the magnetic force characteristic computing program 2P, which is read out from the portable recording medium 2 by the operation unit 10 with the reading unit 13.

The I/F 17 performs: a process of outputting image information or the like outputted by the operation unit 10 as will be described later to the display 14; a process of detecting information to be inputted through the keyboard 15 and sending notification to the operation unit 10; a process of detecting information to be inputted through the mouse 16 and sending notification to the operation unit 10; and the like. An operator (technical personnel), who operates the magnetic force characteristic computing device 1 for designing a magnet and a product provided with a magnet, can utilize the keyboard 15 and the mouse 16 to input information on a magnet which he or she utilizes for designing and cause the operation unit 10 to compute characteristics of the magnet.

An explanation will be given about the process of computing a demagnetizing factor due to heat and a demagnetizing field as a magnetic force characteristic of an Nd—Fe—B series sintered magnet prepared by diffusing a heavy rare-earth element such as Dy and specifying a maximum temperature (demagnetization temperature) at which a demagnetizing factor of the magnet becomes equal to or lower than a predetermined value, at the magnetic force characteristic computing device 1 having the structure described above. Here, the explanation will be given using an example wherein Dy is used as a heavy rare-earth element to be diffused. First, the operation unit 10 computes distribution of an increment (ΔHcJ) of a coercivity (HcJ) after Dy diffusion in a magnet having a characteristic to be computed. The operation unit 10 then computes coercivity (HcJ) distribution in the magnet based on a coercivity of a base material before diffusion, specifies a J/H curve at each location, and computes a demagnetizing factor after the magnet is first used at a predetermined temperature (a second predetermined temperature, e.g., 100° C.) and then the temperature is returned to an ordinary temperature (a first predetermined temperature, e.g., 20° C.), as a magnetic force characteristic of the entire magnet. The operation unit 10 further specifies a demagnetization temperature at which a demagnetizing factor of the magnet becomes equal to or lower than a predetermined value.

Figure 2:
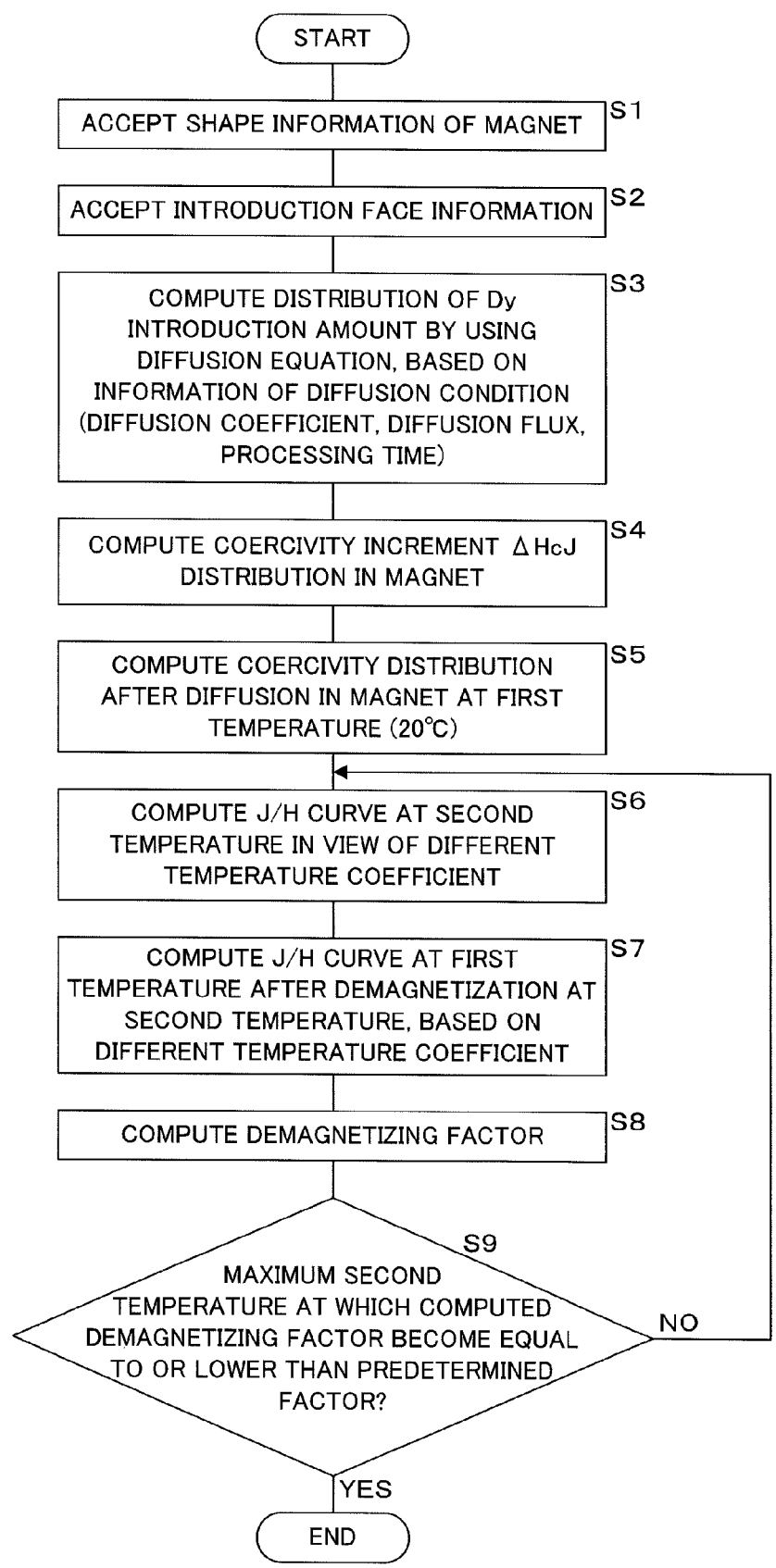
FIG. 2 is a flow chart illustrating an example of a magnetic force characteristic computing process to be executed by an operation unit of the magnetic force characteristic computing device according to the present embodiment.

FIG. 2 is a flow chart illustrating an example of the process procedure of the operation unit 10 of the magnetic force characteristic computing device 1 according to the present embodiment for computing a magnetic force characteristic of a magnet after Dy diffusion.

The operation unit 10 creates a screen for accepting input or selection of shape information indicating the size and shape of a magnet and outputs the screen via the I/F 17 to the display 14 and accepts the shape information of a magnet using the keyboard 15 and the mouse 16 via the I/F 17 (step S1). The operation unit 10 creates a screen for accepting input or selection of introduction face information indicating introduction face from any faces of a magnet prepared by introducing and diffusing Dy and outputs the screen via the I/F 17 to the display 14 and accepts the introduction face information using the keyboard 15 and the mouse 16 via the I/F 17 (step S2). The shape information of a magnet to be accepted in the step S1 is, for example, mesh information (node and element information) of a finite element method. Similarly, the introduction face information to be accepted in the step S2 is information for specifying the number of introduction faces and the respective introduction faces corresponding to the shape information.

The operation unit 10 reads out stored information of diffusion condition (diffusion coefficient, diffusion flux and processing time), corresponding to the accepted shape information and introduction face information, from the diffusion condition database 112. The operation unit 10, with regard to the accepted shape information and introduction face information, by using the Fick's diffusion equation (Fick's second law) as diffusion equation, based on the read out information of diffusion condition (diffusion coefficient, diffusion flux and processing time), computes distribution of Dy introduction amount in a magnet (step S3). Moreover, the diffusion equation and diffusion condition (diffusion coefficient, diffusion flux and processing time) will be described hereafter.

The operation unit 10 computes coercivity increment ΔHcJ distribution in the magnet from the distribution of Dy introduction amount in the magnet computed in the step S3, based on the Dy introduction amount/ΔHcJ database 111 (step S4).

The operation unit 10 then computes coercivity HcJ distribution after Dy diffusion at a first temperature (e.g., an ordinary temperature (20° C.)), based on a magnet characteristic of a magnet before diffusion, i.e., a base material of a magnet and the coercivity increment ΔHcJ computed in the step S4 (step S5). The operation unit 10 computes a J/H curve as a magnetic force characteristic of a case where the temperature of the magnet rises to a second temperature as a demagnetization evaluation temperature (e.g., 100° C.), based on the computed coercivity HcJ distribution in view of a different temperature coefficient (step S6) and computes a J/H curve of a case where a load such as application of a demagnetizing field is first applied in a state where the temperature of the magnet rises to the second temperature as the demagnetization evaluation temperature and then the temperature is returned to the first temperature, based on a stored temperature coefficient (step S7). The operation unit 10 computes a demagnetizing factor at the second temperature as the demagnetization evaluation temperature based on the computation results of the steps S6 and S7 (step S8). The demagnetizing factor used here is a rate of decrease in torque of the characteristic of a motor provided with a magnet to be evaluated at an ordinary temperature before and after reaching the demagnetization evaluation temperature.

Next, the operation unit 10 judges whether or not the second temperature at which the demagnetizing factor is computed in step S8 is a maximum second temperature at which the demagnetizing factor is equal to or lower than a predetermined factor (step S9). In a case where the second temperature is not the maximum second temperature (S9: NO), the process returns to the step S6 and another temperature is set as the second temperature, and then the process from the steps S6 to S8 is repeated. On the other hand, in a case where the operation unit 10 judges that the second temperature is the maximum second temperature (S9: YES), the second temperature is specified as the demagnetization temperature at which the demagnetizing factor of a magnet is equal to or lower than the predetermined factor. Then the process is terminated.

The following description will explain the respective processes illustrated in the flow chart of FIG. 2 in concrete terms. First, an explanation will be given about computation process of distribution of Dy introduction amount in the step S3.

The Fick's diffusion equation (Fick's second law) is used as the diffusion equation. The Fick's diffusion equation is used in diffusion process in unsteady state, which does not view time as unlimited, in other words, it is used when the concentration in diffusion varies with the time elapse. Moreover, Neumann boundary condition or Dirichlet boundary condition is set as the boundary condition at the surface of a magnet.

Figure 3:
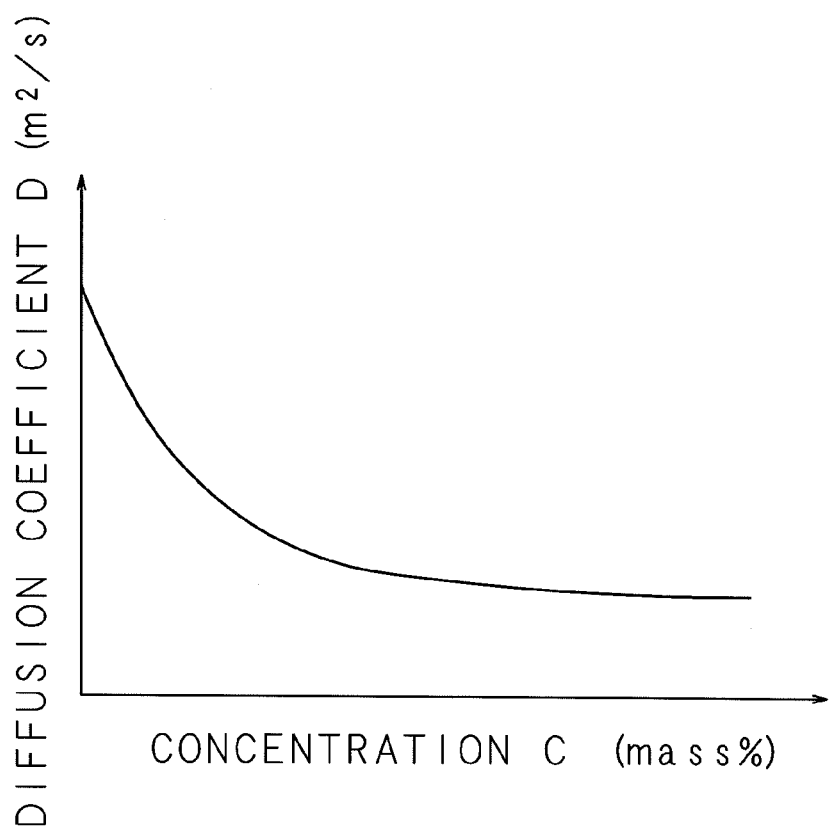
FIG. 3 is an explanatory diagram illustrating the relationship between concentration and diffusion coefficient as an example of the content of a diffusion condition database.

The diffusion coefficient is a coefficient on ease of Dy diffusion. The diffusion flux is Dy amount flowing through a unit area of a diffusion area per unit time. The processing time is time taken to process Dy diffusion. In the present embodiment, the diffusion coefficient is regarded as Dy concentration dependency coefficient. The diffusion coefficient is identified based on the determination of diffusion coefficient (function) in view of concentration dependency. The function indicating diffusion coefficient is determined to conform with the actual measurement result of coercivity increment ΔHcJ. FIG. 3 is an explanatory diagram illustrating the relationship between concentration and diffusion coefficient as an example of the content of a diffusion condition database 112. In FIG. 3, the diffusion coefficient D against the concentration C is illustrated by a graph.

Figure 4:
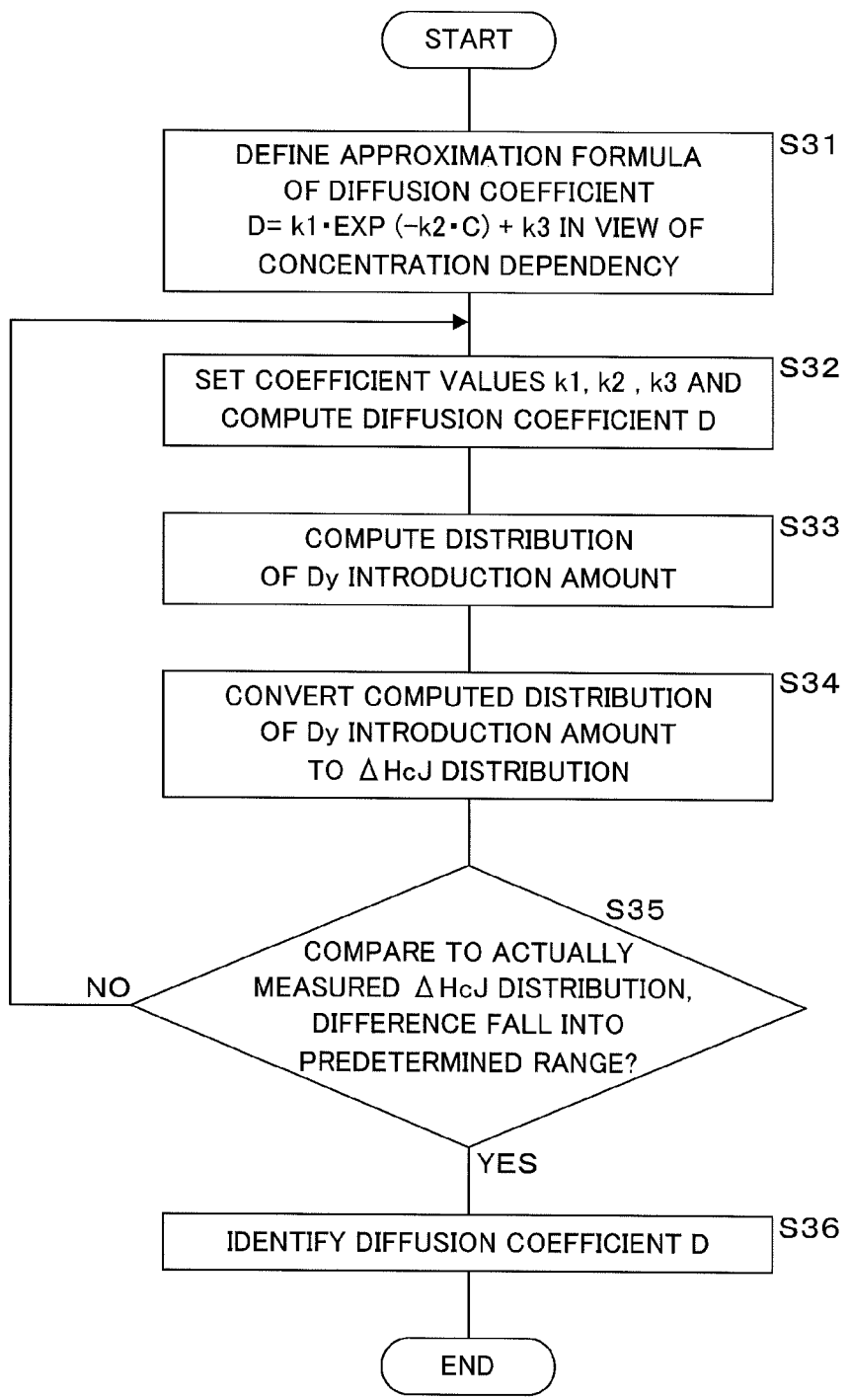
FIG. 4 is a flow chart illustrating an example of identification processing of diffusion coefficient.

The identification process of a diffusion coefficient (determination process of a function) will be described hereafter. FIG. 4 is a flow chart illustrating an example of identification process of a diffusion coefficient executed by the operation unit 10.

The diffusion coefficient D decreases exponentially as the concentration C increases, as interpreted from FIG. 3. First, the operation unit 10 defines the following formula (1) as the approximation formula of diffusion coefficient D in view of concentration dependency (step S31).

$$D = k1 \cdot EXP(-k2 \cdot C) + k3 \tag{1}$$

C: Concentration k1, k2, k3: Coefficient

The operation unit 10 sets the coefficient values k1, k2 and k3, and then computes diffusion coefficient D in accordance with the above formula (1) (step S32). The operation unit 10 uses the diffusion equation based on the computed diffusion coefficient D to compute distribution of Dy introduction amount (step S33). Next, the operation unit 10 converts the computed distribution of Dy introduction amount in the magnet to coercivity increment ΔHcJ distribution in the magnet, based on the Dy introduction amount/ΔHcJ database 111 (step S34).

The operation unit 10 compares the converted coercivity increment ΔHcJ distribution to the actually measured coercivity increment ΔHcJ distribution to judge whether the difference falls into a predetermined range or not (step S35). In a case where the operation unit 10 judges that the difference does not fall into the predetermined range (S35: NO), the process is returned to the step S32. After setting other values as coefficients k1, k2, k3 anew and computing diffusion coefficient D, the process from the steps S33 to S35 is repeated.

On the other hand, in a case where the operation unit 10 judges that the difference falls within the predetermined range (S35: YES), the coefficient values k1, k2, and k3 at that time are used to identify diffusion coefficient D (step S36), and then the process is terminated.

Figure 5:
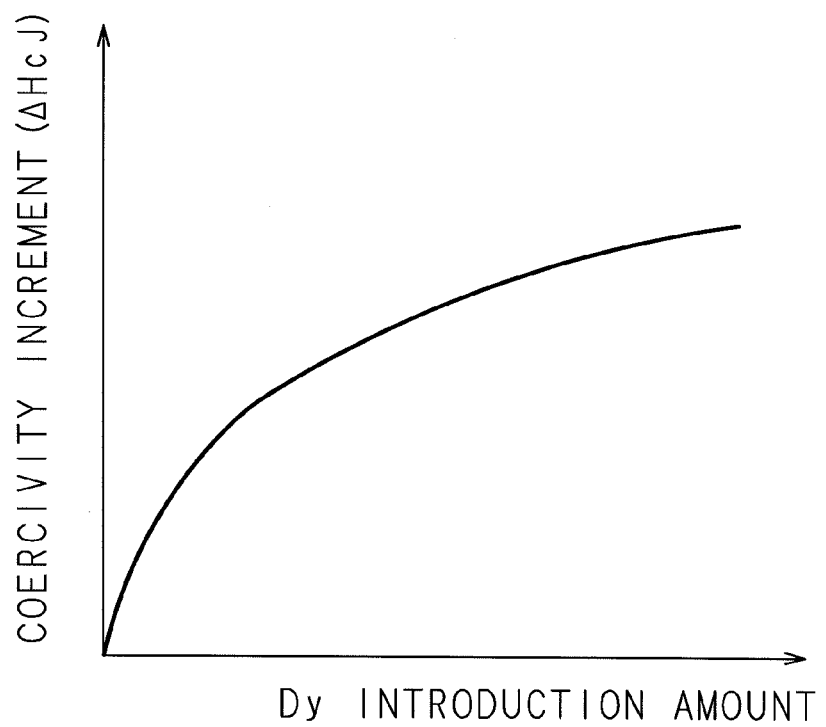
FIG. 5 is an explanatory diagram illustrating the relationship between Dy introduction amount and coercivity increment as an example of the content of a Dy introduction amount/ΔHcJ database.

Next, an explanation will given about the Dy introduction amount/ΔHcJ database 111 in the step S4. FIG. 5 is an explanatory diagram illustrating the relationship between Dy introduction amount and coercivity increment as an example of the content of the Dy introduction amount/ΔHcJ database 111. In FIG. 5, a coercivity increment ΔHcJ against Dy introduction amount is illustrated as a graph. Specifically, the Dy introduction amount/ΔHcJ database 111 may be information of a coercivity increment ΔHcJ for a plurality of different Dy introduction amounts, or may be a numerical formula obtained by approximating the curve illustrated in the explanatory diagram of FIG. 5.

Next, a detailed explanation will be given about a computation process of a J/H curve in the steps S5, S6 and S7. The J/H curve is important information among magnetization curves of a magnet, for specifying a magnetic force characteristic representing a relation between a magnetization intensity J (T) and a magnetic field H (A/m).

Information of a magnetic force characteristic of a magnet, which becomes a base material before diffusion, is stored in the storage unit 11 of the magnetic force characteristic computing device 1. Information of a magnetic force characteristic includes magnetization curves (J/H curve and B/H curve). The operation unit 10 uses a magnetization curve of a base material to obtain a coercivity HcJ at each location based on a coercivity increment ΔHcJ due to diffusion and computes a J/H curve for each location from the obtained coercivity HcJ. The computed J/H curve is corrected using a stored temperature coefficient of each coercivity, so that a magnetic force characteristic at an ordinary temperature (first temperature, e.g., 20° C.) and a magnetic force characteristic at a high temperature (second temperature, e.g., 100° C.) are computed.

Figure 6:
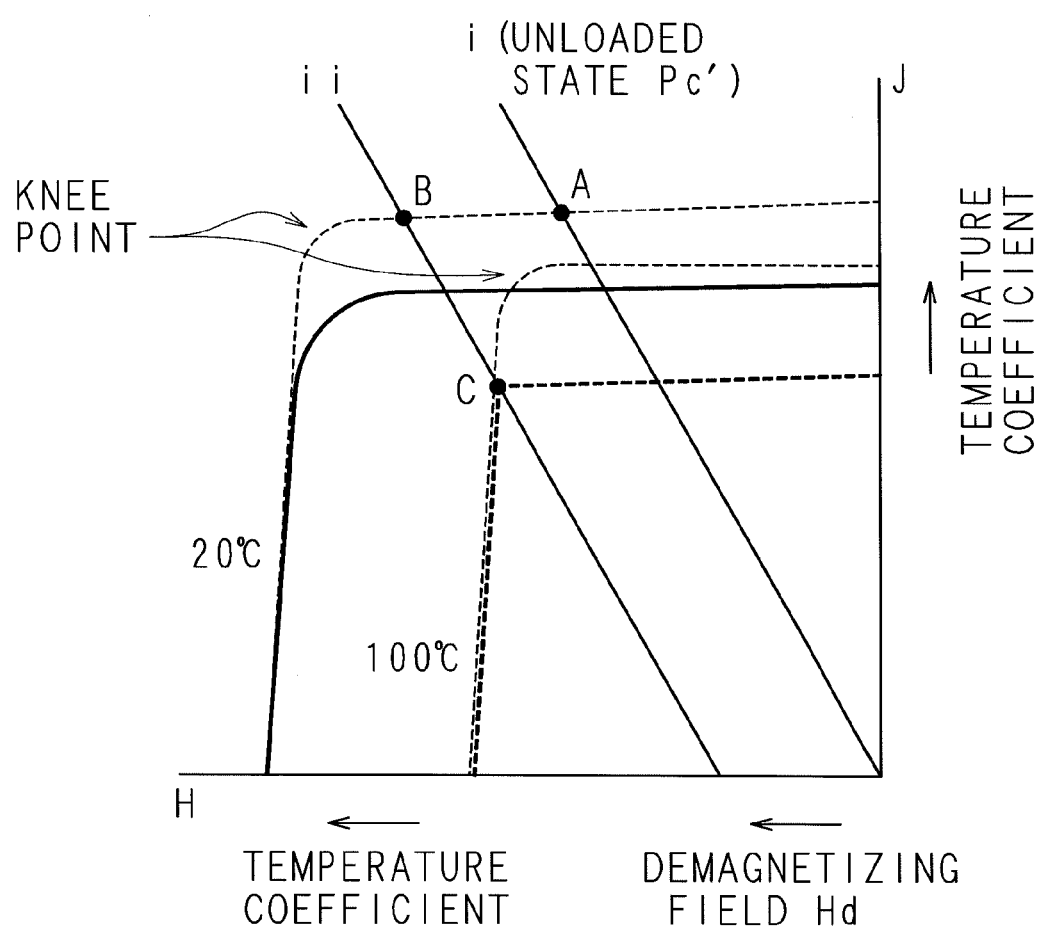
FIG. 6 is a graph illustrating a correction example of a J/H curve.

An explanation will be given about a method for correcting a J/H curve of a case where a magnet is heated to 100° C. and loaded and then the temperature is returned to an ordinary temperature (first temperature, e.g., 20° C.). FIG. 6 is a graph illustrating a correction example of a J/H curve. The magnetic field H is plotted on the abscissa, while the magnetization intensity J is plotted on the ordinate. The thin broken lines in FIG. 6 are used for expressing J/H curves at an arbitrary location in a magnet after diffusion at 20° C. and 100° C.

A permeance coefficient Pc' (line "i" in FIG. 6) on a J/H curve in an unloaded state is computed by processing of the operation unit 10. It is to be noted that a permeance coefficient here is the permeance coefficient on a J/H curve, and hereinafter the same shall apply. The permeance coefficient Pc' in the unloaded state is determined by the shape of a magnet having a magnetic force characteristic to be computed and the magnetic circuit structure, and an operating point at 20° C. in the unloaded state becomes the point of intersection (A) between the line "i" and a J/H curve at 20° C. The operation unit 10 computes an operating point B of a case where a load is applied at 20° C., moves the line "i" to overlap with the operating point B so as to obtain a line "ii", and computes a demagnetizing field Hd from the line "ii". The operation unit 10 computes an operating point C of a case where a demagnetizing field Hd is applied at 100° C., based on a J/H curve and the line "ii" at 100° C. Since the operating point C exists below an inflection point (knee point) of the J/H curve at 100° C., it is clear that irreversible demagnetization has occurred. An equivalent J/H curve of a case where a demagnetizing field Hd is applied at 100° C. so that demagnetization occurs is illustrated by the bold broken line in FIG. 6.

A magnetic field H corresponding to a magnetization intensity J, which is zero on a J/H curve, is a coercivity HcJ, and a magnetization intensity J corresponding to a magnetic field H, which is zero, is a remanence Br. The operation unit 10 computes a J/H curve at 20° C. after irreversible demagnetization at 100° C., based on the stored information of a temperature coefficient described above which represents HcJ and Br of the equivalent J/H curve (bold broken line in FIG. 6) of a case where a demagnetizing field Hd is applied at 100° C. so that demagnetization occurs. The J/H curve at 20° C. after irreversible demagnetization at 100° C. is illustrated by the bold full line in FIG. 6.

It is to be noted that a coercivity of a Dy diffused magnet is not uniform in a magnet and respective locations have different coercivities as described above. Accordingly, respective locations also have different degrees of lowering of a remanence Br and it is therefore necessary to consider a difference in temperature variation of a coercivity for each location in order to obtain a demagnetization characteristic of a magnet with a high degree of accuracy. Accordingly, a temperature coefficient corresponding to a different coercivity (absolute value) is needed.

Figure 7:
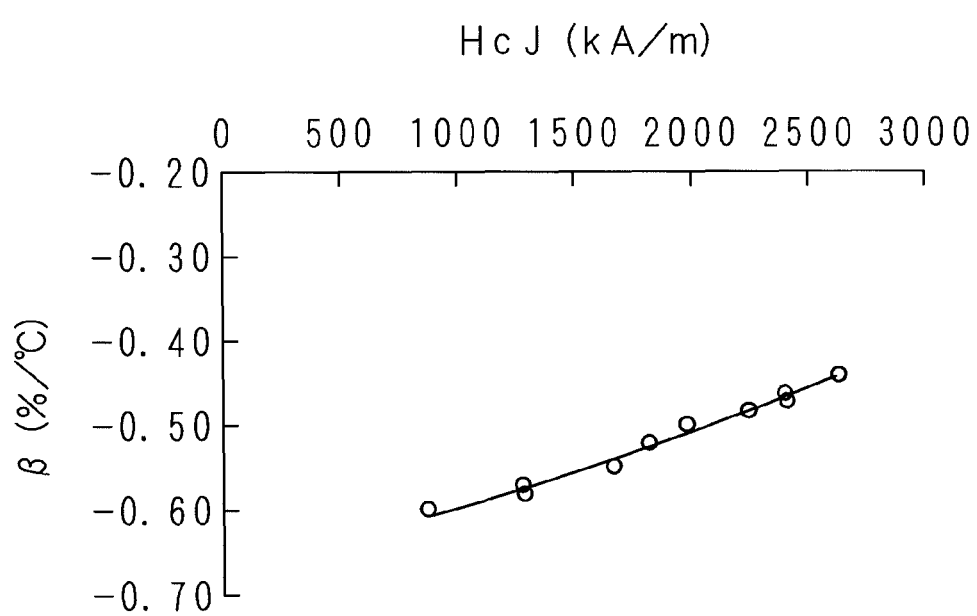
FIG. 7 is a graph illustrating an example of the content of a temperature coefficient of a coercivity preliminarily stored in a storage unit.

FIG. 7 is a graph illustrating an example of the content of a temperature coefficient of a coercivity preliminarily stored in the storage unit 11. In FIG. 7, the coercivity HcJ (kA/m) is plotted on the abscissa, while the rate β (%/° C.) of change in a coercivity against temperature variation is plotted on the ordinate. A quadratic approximation formula, for example, is preliminarily computed for a coercivity HcJ as illustrated by the full line from actually measured values of a coefficient of temperature variation indicated by the white circles in FIG. 7, so that a temperature coefficient can be used for an arbitrary coercivity HcJ varying with location in a magnet after Dy diffusion. Therefore, it becomes possible to compute a magnetic force characteristic of an Nd—Fe—B series sintered magnet after Dy diffusion, which has a coercivity value varying with location, that is, which has a coercivity distribution, with a high degree of accuracy.

In the steps S6 and S7 in the flow chart of FIG. 2, a demagnetization characteristic due to rise in temperature is obtained by correction of a J/H curve using a temperature coefficient. With such a manner, a demagnetizing factor of a case where a load is applied in a state where a magnet after diffusion is heated to 100° C. so that demagnetization occurs can be computed in the step S8. In the computation process in the step S8, it is to be noted that the operation unit 10 converts the J/H curve computed for each location in the step S7 into a B/H curve and computes a demagnetizing factor of the entire magnet by a process based on an existing program for computing the demagnetizing factor.

It is to be noted that it is clear that a magnetizing factor at a different temperature can also be computed by setting the temperature in the step S6 at a temperature other than 100° C., though a demagnetizing factor at 100° C. is obtained by computing a J/H curve at 100° C. in the step S6 and computing a J/H curve of a case where a demagnetizing field is applied at 100° C. so that demagnetization occurs and then the temperature lowers to 20° C. in the step S7. A plurality of demagnetizing factors corresponding to different coercivities can be computed in the step S8 and a temperature (demagnetization temperature) at which a demagnetizing factor becomes equal to or lower than a predetermined factor can be specified in the step S9 and obtained as a demagnetization characteristic of a magnet after Dy diffusion. The degree of lowering of a remanence due to temperature is important, since an Nd—Fe—B series sintered magnet for use in a motor is often used at a high temperature due to rotation of a motor, an environment around a motor or the like. That is, it is necessary to get information on the limit of temperature at which demagnetization does not occur even in continuous use of the magnet. Accordingly, a demagnetizing factor or a demagnetization temperature to be obtained by a magnetic force characteristic computing device 1 according to the present embodiment with a high degree of accuracy is extremely useful information.

As an example (the present embodiment) of a magnetic force characteristic to be computed as described above, a magnetic force characteristic of a magnet for use in an IPM motor, especially a demagnetization characteristic (a demagnetizing factor) of it was computed. The computed demagnetization characteristic and an actually measured demagnetization characteristic were compared each other. This computed result and comparison result will be explained in the following description.

FIG. 8 is a schematic top perspective view of an IPM motor in the present embodiment. Denoted at reference numerical 3 in FIG. 8 is an IPM motor of the present embodiment, and denoted at reference numerical M are Dy diffused Nd—Fe—B series sintered magnets for use in the IPM motor 3. The IPM motor 3 is an inlay structure where the magnets M are set in a rotor to be arranged in a V-shape. The magnets M respectively have a flat plate shape, and the outer peripheral faces of the IPM motor 3 and the faces perpendicular to the outer peripheral faces of the IPM motor 3 are Dy introduction faces of the respective magnets M.

The following magnet is used as a base material of magnet M in the present embodiment.

NMX-S52 (produced by Hitachi Metals, Ltd., Nd—Fe—B series sintered magnet)

Figure 9:
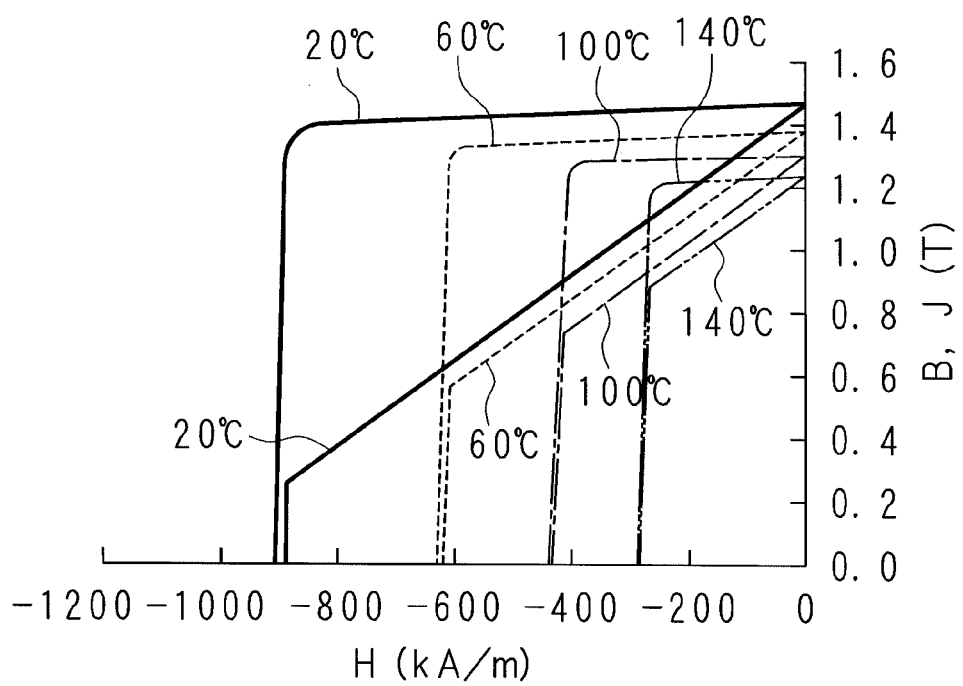
FIG. 9 is a graph illustrating a magnetic force characteristic of a base material of a magnet in the present embodiment.

FIG. 9 is a graph illustrating a magnetic force characteristic of a base material of magnet M in the present embodiment. FIG. 9 includes magnetization curves at 20° C., 60° C., 100° C. and 140° C. The magnetic field H (kA/m) is plotted on the abscissa, while the magnetization intensity B or J (T) is plotted on the ordinate. Upper curves are J/H curves, while lower curves are B/H curves. By preliminarily storing the magnetization curves of a base material illustrated in FIG. 9 in the storage unit 11 of the magnetic force characteristic computing device 1, the operation unit 10 can compute a J/H curve after Dy diffusion and a J/H curve after temperature variation as described above.

Figure 10:
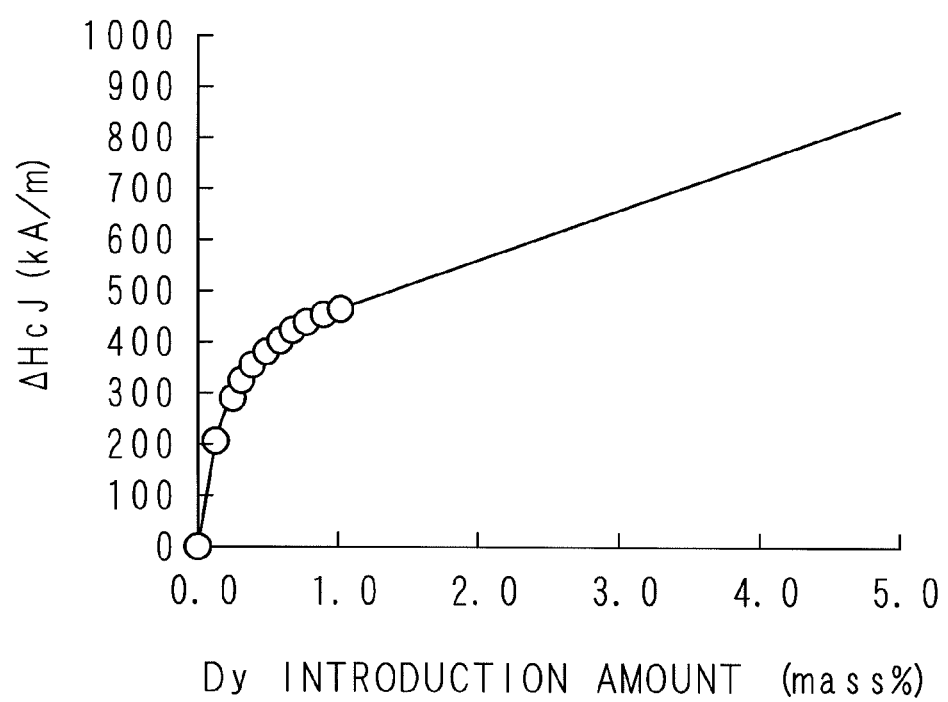
FIG. 10 is a graph illustrating a correspondence between a Dy introduction amount and a coercivity increment ΔHcJ regarding a base material in the present embodiment.

FIG. 10 is a graph illustrating a correspondence between a Dy introduction amount and a coercivity increment ΔHcJ regarding the base material in the present embodiment. The Dy introduction amount (mass %) is plotted on the abscissa, while the coercivity increment ΔHcJ (kA/m) is plotted on the ordinate. The white circles are used to indicate actually measured values and the full line expresses an approximation formula. It is to be noted that illustrations were obtained by cutting out a Dy diffused base material into a strip of a sample having dimensions of 2.8 mm×2.8 mm×1.0 mm and measuring a Dy introduction amount with an ICP (Inductively Coupled Plasma) analysis. Moreover, ΔHcJ was obtained from a difference between a value of a coercivity HcJ of a sample measured with a VSM (Vibrating Sample Magnetometer) and a value of a coercivity HcJ of the base material. As illustrated in FIG. 10, the operation unit 10 can compute ΔHcJ distribution in a magnet as described above by preliminarily storing a corresponding Dy introduction amount/ΔHcJ database 111 in the storage unit 11.

In the present embodiment, diffused magnet was prepared as magnet M by a method described in WO 2007/102391. The diffused magnet was prepared by setting the treatment temperature at 900° C. and supplying and diffusing Dy for 4.0 hours.

Figure 11:
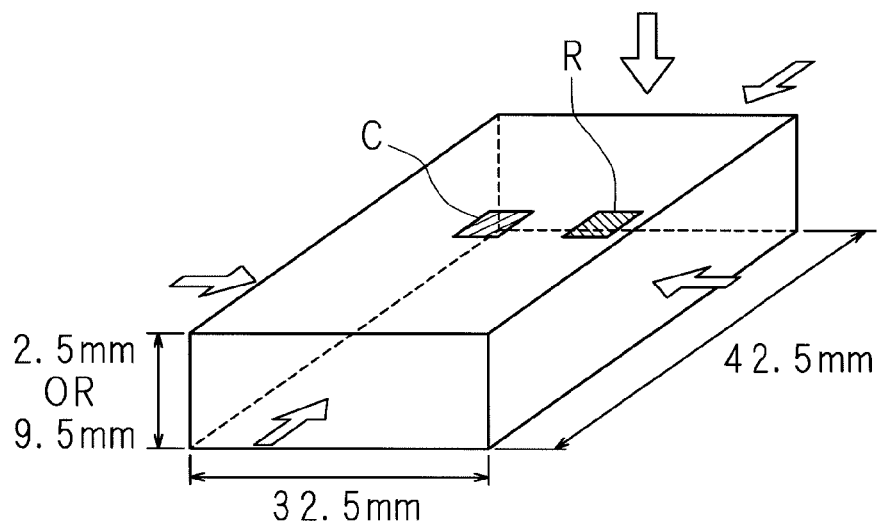
FIG. 11 is an explanatory diagram illustrating shape information of a magnet used for verification of computation accuracy of coercivity increment ΔHcJ distribution.

Here, a verification result regarding the accuracy of computation of the diffusion equation with regard to coercivity increment ΔHcJ distribution against actually measured depth δ for identifying the diffusion coefficient will be illustrated. The depth δ refers to the distance from the diffused surface. FIG. 11 is an explanatory diagram illustrating shape information of a magnet used for verification of computation accuracy of coercivity increment ΔHcJ distribution. Used for verification were flat rectangular parallelepiped magnets, which had length of 42.5 mm, width of 32.5 mm, and thickness of 2.5 mm or 9.5 mm. Dy diffusion was performed for the respective magnets using a method described in WO 2007/102391 under the same condition and then a coercivity increment ΔHcJ was measured at a center part C and a rim part R of the top face of magnets. It is to be noted that a rim part of the top face is positioned 2.0 mm away from a long side (42.5 mm) and approximately 24 mm away from a short side (32.5 mm). As illustrated by the white arrows in FIG. 11, Dy was diffused from the top face and respective four side faces into each magnet in the same manner. Here, an ICP analysis method was used for measurement of Dy concentration. A coercivity HcJ was measured by cutting out a magnet for each measurement location of 2.8 mm×2.8 mm×1.0 mm and using a VSM. It is to be noted that a plurality of magnets prepared under the same condition were used for measurement in order to make a measurement in the ICP analysis method and in the VSM with a measurement pitch of 0.5 mm.

The diffusion coefficient to be used in the diffusion equation was identified, based on distribution of actually measured values of a coercivity increment ΔHcJ against depth δ at the center part of a magnet. On this occasion, the diffusion flux was set at $1.0 \times 10^{-7}$ (mass %) and the processing time was set at 14400 (sec), as fixed conditions. Moreover, the diffusion coefficient is approximated with the above-mentioned formula (1): $D = k1 \cdot EXP(-k2 \cdot C) + k3$ (C: concentration; k1, k2, k3: coefficients), and these coefficient values k1, k2, and k3 were obtained according to the flow chart illustrated in FIG. 4. The diffusion coefficient D was specifically identified in the following formula (2) by using the obtained coefficient values.

$$D = 5.0 \times 10^{-11} \cdot EXP(-7.0 \cdot C) + 1.1 \times 10^{11} \qquad (2)$$

Figure 12:
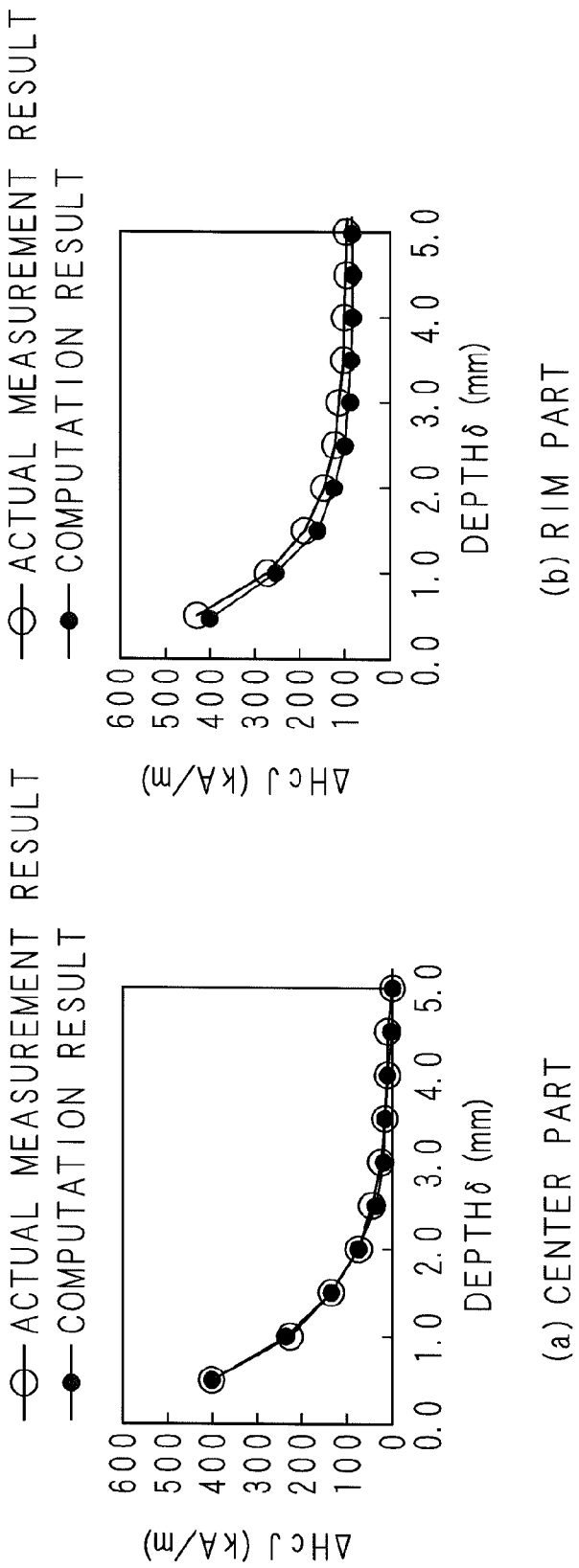
FIG. 12 is a graph illustrating computation result and actual measurement result of coercivity increment ΔHcJ distribution at depth δ of a magnet (having a thickness of 9.5 mm) in the present embodiment.

FIG. 12 is a graph illustrating computation result and actual measurement result of coercivity increment ΔHcJ distribution at depth (distance) δ respectively at the center part C (FIG. 12(a)) and the rim part R (FIG. 12 (b)) of a magnet having a thickness of 9.5 mm. In FIG. 12, the depth δ expressed in the unit "mm (millimeter)" is plotted on the abscissa, while the coercivity increment ΔHcJ expressed in the unit "kA/m (kiloampere per meter)" is plotted on the ordinate. In FIG. 12, computation result ("■" marks) and actual measurement result ("○" marks) of coercivity increment ΔHcJ distribution at depth δ in the range from 0.5 mm to 5.0 mm with the interval of 0.5 mm are matched at the center part and the rim part with higher accuracy.

Figure 13:
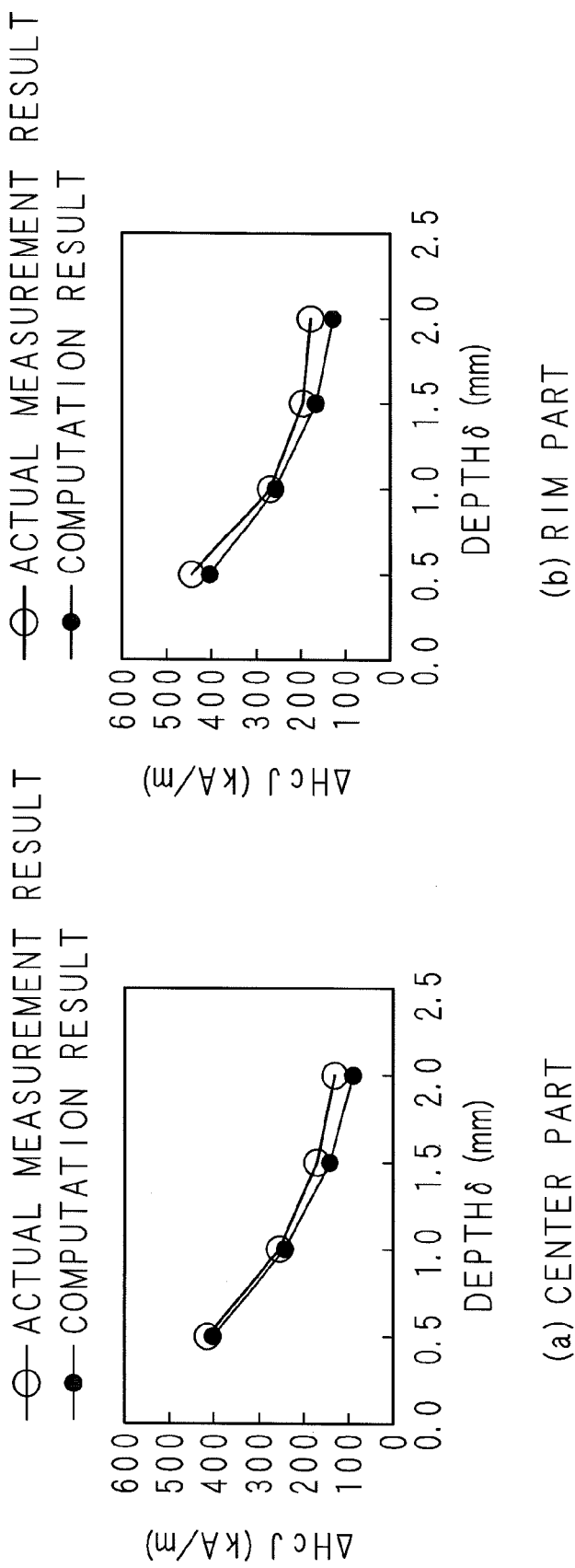
FIG. 13 is a graph illustrating computation result and actual measurement result of coercivity increment ΔHcJ distribution at depth δ of a magnet (having a thickness of 2.5 mm) in the present embodiment.

FIG. 13 is a graph illustrating computation result and actual measurement result of coercivity increment ΔHcJ distribution at depth (distance) δ respectively at the center part C (FIG. 13(a)) and the rim part R (FIG. 13(b)) of a magnet having a thickness of 2.5 mm. The abscissa and ordinate of FIG. 13 are the same as in FIG. 12. In FIG. 13, computation result ("■" marks) and actual measurement result ("○" marks) of coercivity increment ΔHcJ distribution at depth δ in the range from 0.5 mm to 2.0 mm with the interval of 0.5 mm are matched at the center part and the rim part with higher accuracy.

Figure 14:
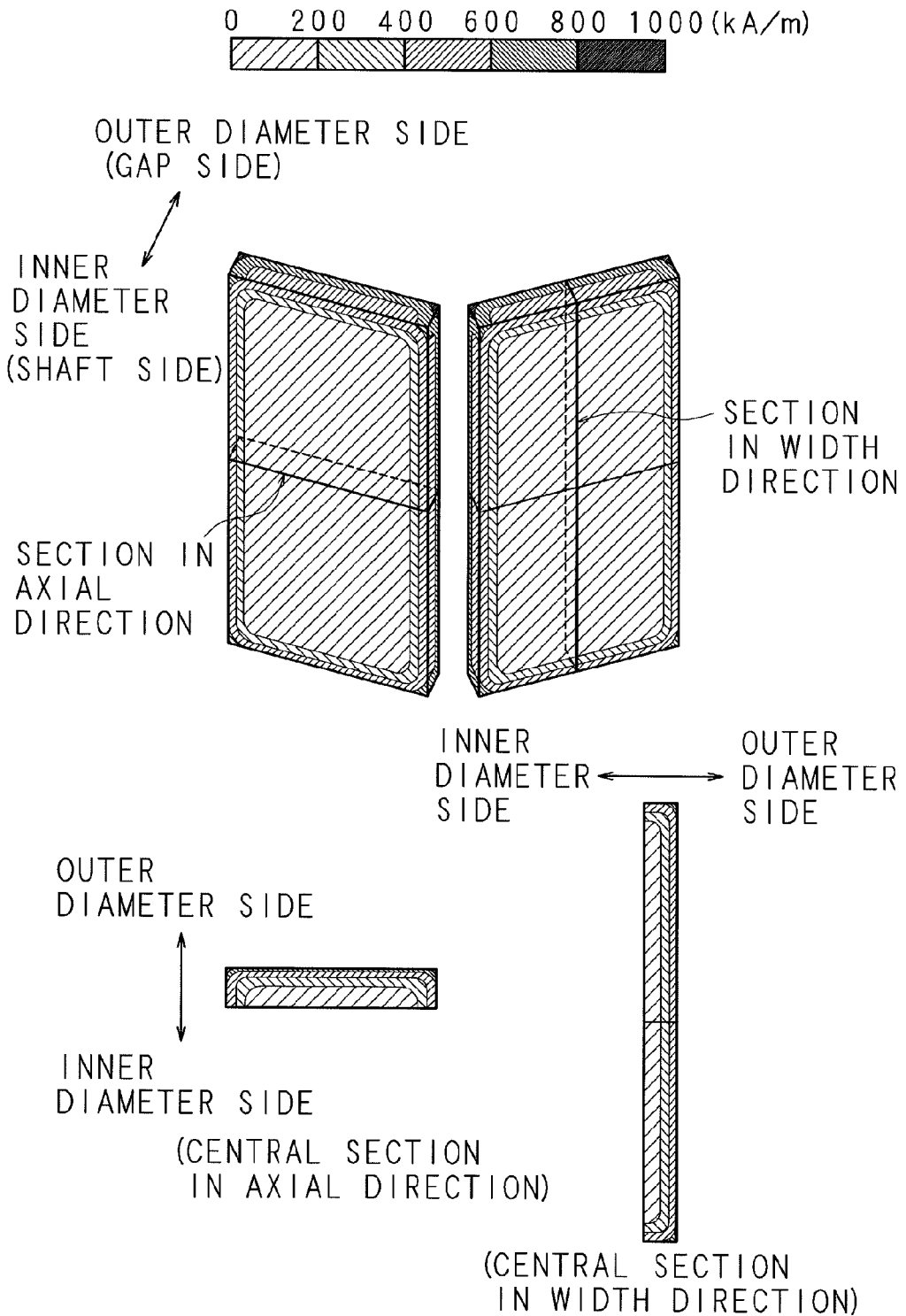
FIG. 14 is a schematic diagram for schematically illustrating an example of ΔHcJ distribution computed regarding the magnet in the present embodiment.

FIG. 14 is a schematic diagram for schematically illustrating an example of ΔHcJ distribution computed regarding the magnet M in the present embodiment. In the example shown in FIG. 14, ΔHcJ distribution is illustrated on a central section in axial direction and on a central section in width direction of the magnet M. As described above, an outer peripheral face of the IPM motor 3 and the face perpendicular to the outer peripheral face are Dy introduction faces of the magnet M. Accordingly, computation shows that a coercivity increment ΔHcJ in the magnet M is distributed to be large at the both side parts of the outer peripheral face and the face perpendicular to the outer peripheral face and decrease towards the center side of the IPM motor 3.

Figure 15:
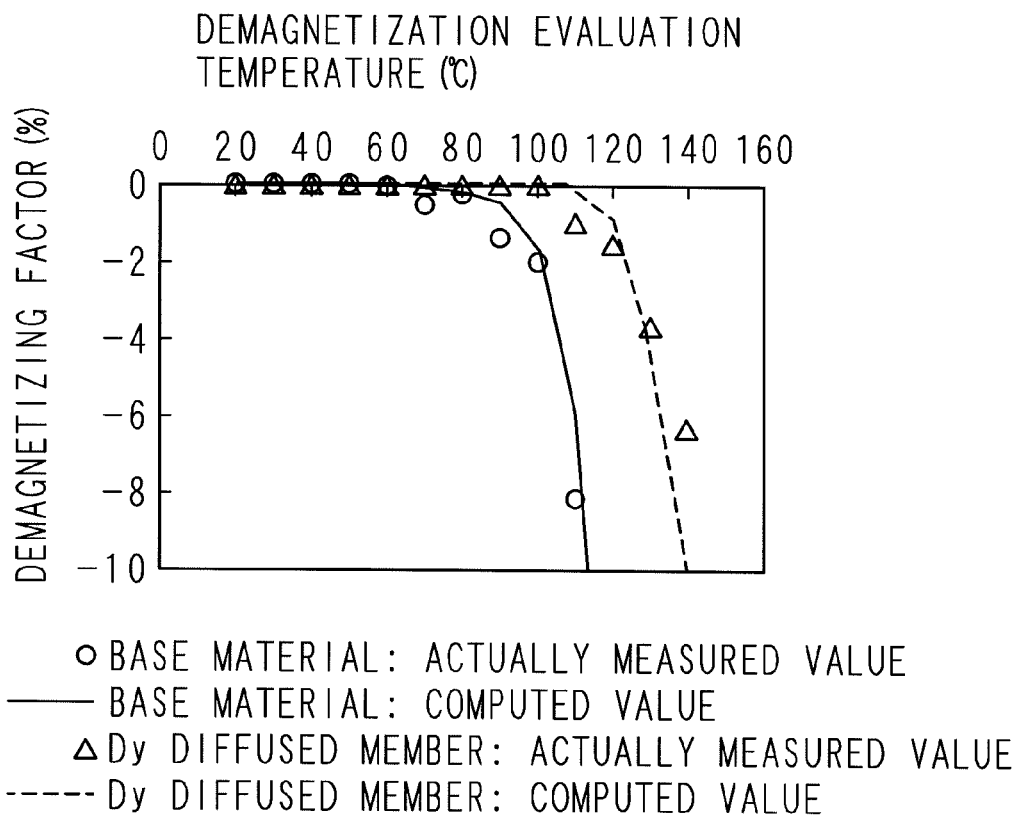
FIG. 15 is a graph illustrating an example of comparison between computation result and actual measurement result of demagnetization characteristic of an IPM motor provided with a magnet in the present embodiment.

FIG. 15 is a graph illustrating an example of comparison between computation result and actual measurement result of demagnetization characteristic of the IPM motor 3 provided with the magnet M in the present embodiment having the ΔHcJ distribution illustrated in FIG. 14. In FIG. 15, the demagnetization evaluation temperature (° C.) for evaluating a demagnetizing factor is plotted on the abscissa, while the demagnetizing factor (%) is plotted on the ordinate. The "○" marks are used to indicate actually measured values of a demagnetizing factor against different temperatures of a base material before Dy diffusion treatment, and the solid line is used to indicate computed values thereof. The "Δ" marks are used to indicate actually measured values of a demagnetizing factor of the magnet M, which is prepared by Dy diffusion, and the dotted line is used to indicate computed values thereof.

It is to be noted that a demagnetizing factor was obtained by causing the IPM motor 3 provided with a magnet M to operate in a thermostatic bath at a preset temperature, returning the temperature to an ordinary temperature, measuring a torque in an ordinary temperature state and computing a rate of decrease from a torque at an ordinary temperature obtained before applying a load. It is to be noted that the temperature of the thermostatic bath was set at every 10° C. from 50° C. to 140° C. as illustrated in FIG. 15 and the IPM motor 3 was rotated at the respective set temperatures.

By focusing on a set temperature at which a demagnetizing factor became 2% in the computation result and actual measurement result of a demagnetizing factor illustrated in FIG. 15, the following fact is to be understood. An actually measured value of a temperature at which a demagnetizing factor of a base material became 2% was 101° C. and a computation result thereof was 100°, which had an error of +1° C. An actually measured value of a temperature at which a demagnetizing factor of the magnet M prepared by Dy diffusion became 2% was 122° C. and a computation result thereof was 124° C., which had an error of +2° C. Accordingly, the analytical error is below 10° C., this shows that a demagnetization characteristic could be analyzed with a satisfactory degree of accuracy. It is to be understood that heat resistance of demagnetization of the magnet M was enhanced by Dy diffusion.

Figure 16:
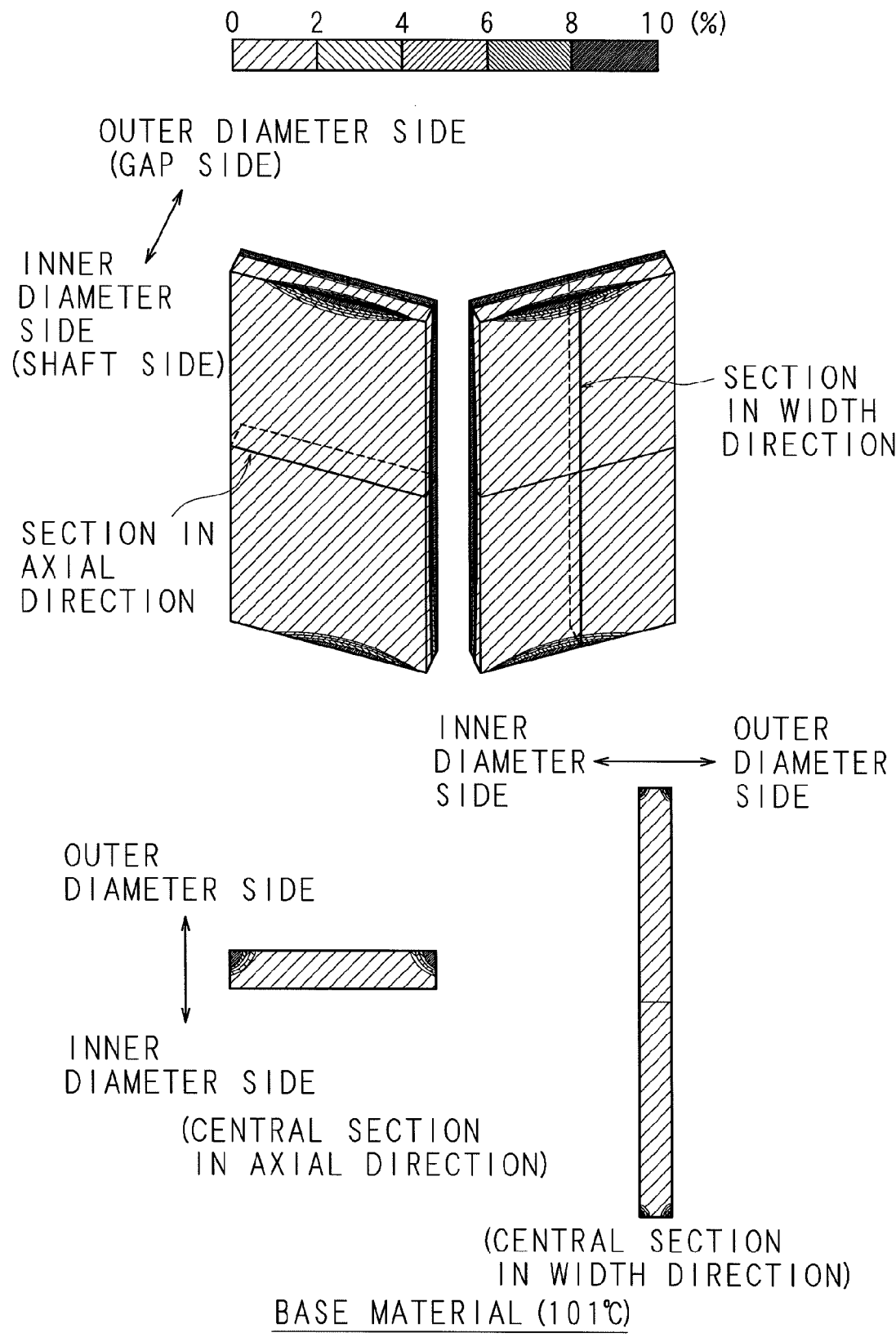
FIG. 16 is a schematic diagram for schematically illustrating a computation result of distribution of a Br decrease rate at a temperature at which the magnet (base material) in the present embodiment is demagnetized by 2%.
Figure 17:
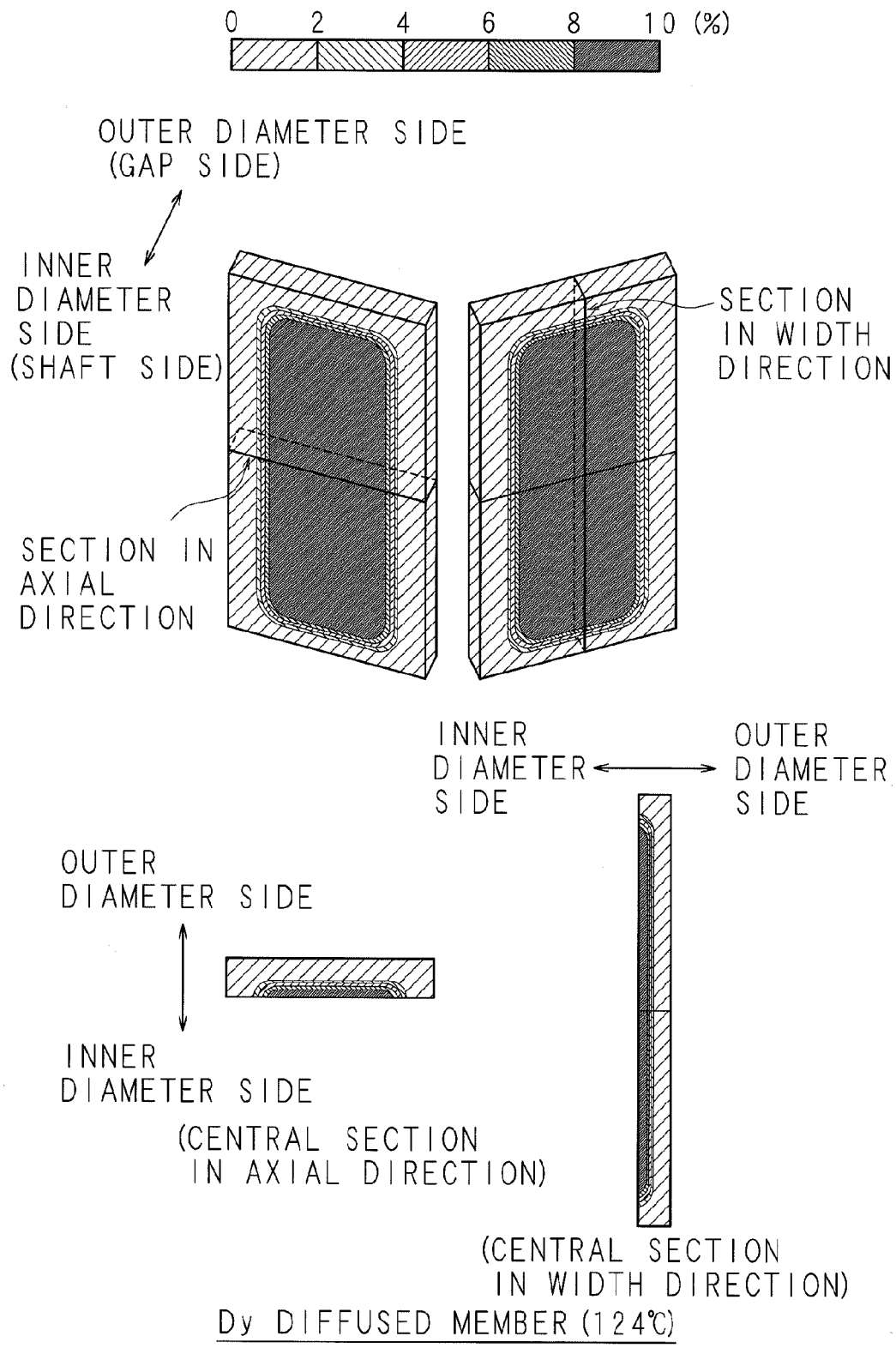
FIG. 17 is a schematic diagram for schematically illustrating a computation result of distribution of a Br decrease rate at a temperature at which the magnet (Dy diffused member) in the present embodiment is demagnetized by 2%.

FIGS. 16 and 17 are schematic diagrams for schematically illustrating a computation result of distribution of a Br decrease rate at a temperature at which a magnet M in the present embodiment having the ΔHcJ distribution illustrated in FIG. 14 is demagnetized by 2%. An example of a base material is illustrated in FIG. 16, and an example of the diffused member (magnet M prepared by Dy diffusion) is illustrated in FIG. 17. In all cases, distribution is illustrated on a central section in axial direction and on a central section in width direction of the base material and the magnet M, as is the case with FIG. 14. As described above, a demagnetizing factor of the base material is computed to become 2% at 100° C. Though a base material has uniform distribution of a coercivity, a Br decrease rate has such a distribution that the Br decrease rate is the highest at the corner portion of the outer side of the IPM motor 3. The demagnetizing factor of the magnet M prepared by Dy diffusion is computed to become 2% at 124° C. Regarding the Br decrease rate at this time, the Br decrease rate tends to be low at a location having a large coercivity increment illustrated in FIG. 14 and high at a location having a small coercivity increment. Here, it is to be noted that a Br decrease rate was computed from a Br decrease amount obtained by heating the magnet M to the temperature at which demagnetization evaluation is performed, applying a demagnetizing field, and then returning the temperature to a room temperature (approximately 20° C.).

As illustrated in the present embodiment, processing based on the magnetic force characteristic computing program 1P of the magnetic force characteristic computing device 1 makes it possible to obtain a demagnetizing factor with a high degree of accuracy from a computation result of distribution of a coercivity increment ΔHcJ varying with location in an Nd—Fe—B series sintered magnet obtained by diffusing a heavy rare-earth element such as Dy.

An example of using Dy as a heavy rare-earth element is described. However, the present invention is not limited to this case and can be applied widely to computation of a magnetic force characteristic of a magnet prepared by diffusing a heavy rare-earth element such as Tb. Additionally, an example of adopting flat-plate shaped magnet is described. However, the present invention is not limited to this example and can be widely used for computing a magnetic force characteristic of an arch-shaped, ring-shaped or rod-shaped magnet. Moreover, the motor is not limited to an IPM motor and can be applied to an SPM motor.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

DESCRIPTION OF REFERENCE SIGNS

1 Magnetic Force Characteristic Computing Device
10 Operation Unit
11 Storage Unit 111 Dy Introduction Amount/ΔHcJ Database (Introduction Amount/Coercivity Increment Characteristic Information)
112 Diffusion Condition Database (Diffusion Coefficient, Diffusion Flux, and Processing Time Regarding Diffusion of Rare-Earth Element)
1P Magnetic Force Characteristic Computing Program
2P Magnetic Force Characteristic Computing Program
M Magnet

The invention claimed is:

1. A calculating method of magnetic force characteristic for obtaining a magnetic force characteristic in a magnet prepared by introducing a heavy rare-earth element from a surface of the magnet and diffusing the heavy rare-earth element into inside of the magnet, the method comprising:
 a step of preliminarily storing introduction amount/coercivity increment characteristic information indicating a characteristic of an increment of a coercivity due to introduction and diffusion against introduction amount of a heavy rare-earth element, and information of diffusion condition containing a diffusion coefficient, a diffusion flux and a processing time regarding diffusion of a heavy rare-earth element;
 a first step of accepting shape information indicating a dimension and a shape of the magnet;
 a second step of accepting introduction face information in accordance with the accepted shape information;
 a third step of computing introduction amount distribution of the introduced heavy rare-earth element in the magnet by using a diffusion equation based on the stored information of diffusion condition; and
 a fourth step of computing distribution of a coercivity increment due to introduction and diffusion of a heavy rare-earth element in the magnet, based on the computed introduction amount distribution and the stored introduction amount/coercivity increment characteristic information.

2. The calculating method of magnetic force characteristic according to claim 1, wherein the diffusion coefficient is expressed by a function of concentration dependency of an introduced heavy rare-earth element.

3. The calculating method of magnetic force characteristic according to claim 1, further comprising:
 a step of preliminarily storing a magnetization curve before diffusion of a heavy rare-earth element and information of a temperature coefficient indicating a coercivity variation due to temperature variation of a magnet against different coercivities;
 a fifth step of computing a magnetization curve at a first predetermined temperature at each location of the magnet, based on the stored magnetization curve and the distribution of a coercivity increment computed in the fourth step;
 a sixth step of computing a magnetization curve at a second predetermined temperature, based on the computed magnetization curve and the stored information of a temperature coefficient; and
 a seventh step of computing a demagnetizing factor at the first predetermined temperature after different demagnetizing fields are applied to respective locations at the second predetermined temperature causing demagnetization, based on the magnetization curve computed in the sixth step.

4. The calculating method of magnetic force characteristic according to claim 3, further comprising:
 an eighth step of computing a demagnetization characteristic of the magnet at different temperatures, based on the distribution of a coercivity increment computed in the fourth step; and
 a ninth step of specifying a demagnetization temperature at which a demagnetizing factor of the magnet becomes equal to or lower than a predetermined factor.

5. A magnetic force characteristic computing device for obtaining a magnetic force characteristic in a magnet prepared by introducing a heavy rare-earth element from a surface of the magnet and diffusing the heavy rare-earth element into inside of the magnet, the device comprising:
 a first storage unit configured to preliminarily store introduction amount/coercivity increment characteristic information indicating a characteristic of an increment of a coercivity due to introduction and diffusion against introduction amount of a heavy rare-earth element, and information of diffusion condition containing a diffusion coefficient, a diffusion flux and a processing time regarding diffusion of a heavy rare-earth element;
 a first acceptance unit configured to accept shape information indicating a dimension and a shape of the magnet;
 a second acceptance unit configured to accept introduction face information in accordance with the accepted shape information;
 a first computation unit configured to compute introduction amount distribution of the introduced heavy rare-earth element in the magnet by using a diffusion equation based on the information of diffusion condition stored in the first storage unit; and
 a second computation unit configured to compute distribution of a coercivity increment due to introduction and diffusion of a heavy rare-earth element in the magnet, based on the introduction amount distribution computed by the first computation unit and the introduction amount/coercivity increment characteristic information stored in the first storage unit.

6. The magnetic force characteristic computing device according to claim 5, further comprising:
 a second storage unit configured to preliminarily store a magnetization curve before diffusion of a heavy rare-earth element and information of a temperature coefficient indicating a coercivity variation due to temperature variation of a magnet against different coercivities;
 a third computation unit configured to compute a magnetization curve at a first predetermined temperature at each location of the magnet, based on the magnetization curve stored in the second storage unit and the distribution of a coercivity increment computed by the second computation unit;
 a fourth computation unit configured to compute a magnetization curve at a second predetermined temperature, based on the magnetization curve computed by the third computation unit and the information of a temperature coefficient stored in the second storage unit; and
 a fifth computation unit configured to compute a demagnetizing factor at the first predetermined temperature after different demagnetizing fields are applied to respective locations at the second predetermined temperature causing demagnetization, based on the magnetization curve computed by the fourth computation unit.

7. The magnetic force characteristic computing device according to claim 6, further comprising:

a sixth computation unit configured to compute a demagnetization characteristic of the magnet at different temperatures, based on the distribution of a coercivity increment computed by the second computation unit; and a specification unit configured to specify a demagnetization temperature at which a demagnetizing factor of the magnet becomes equal to or lower than a predetermined factor.

8. A non-transitory computer-readable recording medium, in which is recorded a computer program for causing a computer provided with a storage unit to compute a magnetic force characteristic in a magnet prepared by introducing a heavy rare-earth element from a surface of the magnet and diffusing the heavy rare-earth element into inside of the magnet, using introduction amount/coercivity increment characteristic information indicating a characteristic of an increment of a coercivity due to introduction and diffusion against introduction amount of a heavy rare-earth element and information of diffusion condition containing a diffusion coefficient, a diffusion flux and a processing time regarding diffusion of a heavy rare-earth element, stored in the storage unit, the computer program causing the computer to execute:

a first step of obtaining shape information indicating a dimension and a shape of the magnet;

a second step of obtaining introduction face information in accordance with the shape information;

a third step of computing introduction amount distribution of the introduced heavy rare-earth element in the magnet by using a diffusion equation based on the stored information of diffusion condition; and a fourth step of computing distribution of a coercivity increment due to introduction and diffusion of a heavy rare-earth element in the magnet, based on the computed introduction amount distribution and the stored introduction amount/coercivity increment characteristic information.

9. The recording medium according to claim 8, wherein the computer is provided with a storage unit storing a magnetization curve before diffusion of a heavy rare-earth element and information of a temperature coefficient indicating a coercivity variation due to temperature variation of a magnet against different coercivities, and the computer program further causes the computer to execute:

a fifth step of computing a magnetization curve at a first predetermined temperature at each location of the magnet, based on the stored magnetization curve and the distribution of a coercivity increment computed in the fourth step;

a sixth step of computing a magnetization curve at a second predetermined temperature, based on the computed magnetization curve and the stored information of a temperature coefficient; and a seventh step of computing a demagnetizing factor at the first predetermined temperature after different demagnetizing fields are applied to respective locations at the second predetermined temperature causing demagnetization, based on the magnetization curve computed in the sixth step.

10. The recording medium according to claim 9, wherein the computer program further causes the computer to execute:

an eighth step of computing a demagnetization characteristic of the magnet at different temperatures, based on the distribution of a coercivity increment computed in the fourth step; and a ninth step of specifying a demagnetization temperature at which a demagnetizing factor of the magnet becomes equal to or lower than a predetermined factor.

* * * * *